US012144154B1

(12) United States Patent
Patel

(10) Patent No.: US 12,144,154 B1
(45) Date of Patent: Nov. 12, 2024

(54) SYSTEM FOR RECAPTURING WASTE HEAT FROM COMPUTING DEVICES

(71) Applicant: Core Scientific Operating Company, Bellevue, WA (US)

(72) Inventor: Harsh Patel, Stone Mountain, GA (US)

(73) Assignee: Core Scientific, Inc., Austin, TX (US)

( * ) Notice: Subject to any disclaimer, the term of this patent is extended or adjusted under 35 U.S.C. 154(b) by 252 days.

(21) Appl. No.: 17/738,654

(22) Filed: May 6, 2022

Related U.S. Application Data

(60) Provisional application No. 63/185,447, filed on May 7, 2021.

(51) Int. Cl.
*H05K 7/20* (2006.01)
*F24F 12/00* (2006.01)
*F24F 110/10* (2018.01)

(52) U.S. Cl.
CPC ......... *H05K 7/20836* (2013.01); *F24F 12/00* (2013.01); *H05K 7/20736* (2013.01); *H05K 7/20745* (2013.01); *F24F 2110/10* (2018.01)

(58) Field of Classification Search
CPC ................................. G06F 1/20; G06F 1/206
See application file for complete search history.

(56) References Cited

U.S. PATENT DOCUMENTS

| 10,959,349 | B1* | 3/2021 | Patel | H05K 7/20209 |
| 11,714,470 | B2* | 8/2023 | Leung | F24F 11/80 |
| | | | | 700/299 |
| 2021/0018968 | A1* | 1/2021 | Leung | H05K 7/20172 |
| 2021/0102719 | A1* | 4/2021 | Whitehead | H05K 5/0212 |
| 2022/0142008 | A1* | 5/2022 | Patel | H05K 7/20172 |
| | | | | 361/679.48 |
| 2022/0225545 | A1* | 7/2022 | Heydari | H05K 7/20736 |

* cited by examiner

*Primary Examiner* — Anthony Q Edwards
(74) *Attorney, Agent, or Firm* — Fishman Stewart PLLC

(57) ABSTRACT

A system and method for recapturing waste heat from computing devices are disclosed. The system includes at least one computing device, a heating, ventilation, and air conditioning (HVAC) unit, an exhaust duct leading from the computing device to the HVAC unit, a bypass duct fluidly connected to the exhaust duct for bypassing the HVAC unit, a control valve disposed in the exhaust duct, and a controller operatively connected to the control valve. The control valve is switchable between an open position where a flow of exhaust air is sent to the HVAC unit, and a closed position where the flow of exhaust air is redirected to the bypass duct.

7 Claims, 4 Drawing Sheets

SYSTEM FOR RECAPTURING WASTE HEAT FROM COMPUTING DEVICES

CROSS-REFERENCE TO RELATED APPLICATION

This application claims the benefit of and priority to U.S. Provisional Patent Application Ser. No. 63/185,447, filed on May 7, 2021, the disclosure of which is hereby incorporated by reference in its entirety as though fully set forth herein.

TECHNICAL FIELD

The present disclosure generally relates to recapturing waste heat from computing devices such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for crypto-currencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing units (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU—or GPU-based systems used for compute-intensive workloads (e.g., rendering, artificial intelligence, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Typically, the heated air is vented to the atmosphere to remove the waste heat from the computing devise and data center. A significant drawback to this approach is that the heat generated due to energy use by the computing devices is wasted by being released into the environment.

For at least these reasons, there is a desire for a more energy efficient solution to allow for improved efficient cooling and utilization of waste heat from one or more computing devices such as in a data center.

SUMMARY

A system and method for recapturing waste heat from computing devices are contemplated.

According to an aspect of the disclosure, there is provided a system for recapturing waste heat from computing devices including at least one computing device; a heating, ventilation, and air conditioning (HVAC) unit; an exhaust duct leading from the at least one computing device to the HVAC unit; a bypass duct fluidly connected to the exhaust duct, for bypassing the HVAC unit; a control valve disposed in the exhaust duct, structured and arranged to switch between an open position where a flow of exhaust air is sent to the HVAC unit, and a closed position where the flow of exhaust air is redirected to the bypass duct; and a controller operatively connected to the control valve and configured to switch the control valve between the closed position and the open position depending on a temperature of the exhaust air. The control valve may be adjusted to any range between the completely open position and the completely closed position to regulate the amount of exhaust air that is distributed to the HVAC unit and the bypass duct. The waste heat generated by the computing device can be recaptured or repurposed by the HVAC unit to save on energy usage and offset carbon usage, as a heating device of the HVAC unit can be operated at reduced power or switched off so that the energy consumption can be reduced.

Pursuant to an implementation, the controller is configured to switch the control valve from the closed position to the open position when the temperature is below a predetermined temperature.

Additionally or alternatively, the controller is configured to switch the control valve to an intermediate position when the temperature is above a predetermined temperature. In the intermediate position, the control valve directs a partial flow of exhaust air to the HVAC unit and a remainder of the flow of exhaust air to the bypass duct.

At least one sensor, e.g., a temperature sensor and/or a humidity sensor, may be arranged in the exhaust duct for measuring and monitoring a temperature and/or humidity of the exhaust air in the exhaust duct.

Pursuant to an implementation, the control valve may be disposed in the exhaust duct between the bypass duct and an inlet of the HVAC unit, for controlling the amount of flow to the HVAC unit and the bypass duct.

According to another aspect, there is provided a method of recapturing waste heat from computing devices including drawing in ambient air into at least one computing device, extracting heat from the at least one computing device and exhausting the heated air into an exhaust duct; measuring a temperature of the heated air in the exhaust duct; controlling a valve to switch between an open position where the valve sends the heated air to a heating, ventilation, and air conditioning (HVAC) unit, and a closed position where the valve directs the heated air to a bypass duct that releases the heated air to the atmosphere; and switching the valve from the closed position to the open position when the temperature is below a predetermined temperature.

Pursuant to an implementation, the method further includes switching the valve from the open position to an intermediate position when the temperature is above the predetermined temperature, wherein in the intermediate position the control valve directs a partial flow of heated air to the HVAC unit and a remainder flow of the heated air to the bypass duct.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

While the claims are not limited to a specific illustration, an appreciation of the various aspects is best gained through a discussion of various examples thereof. Although the drawings represent illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrations are described in detail by referring to the drawings as follows.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Figure 1:
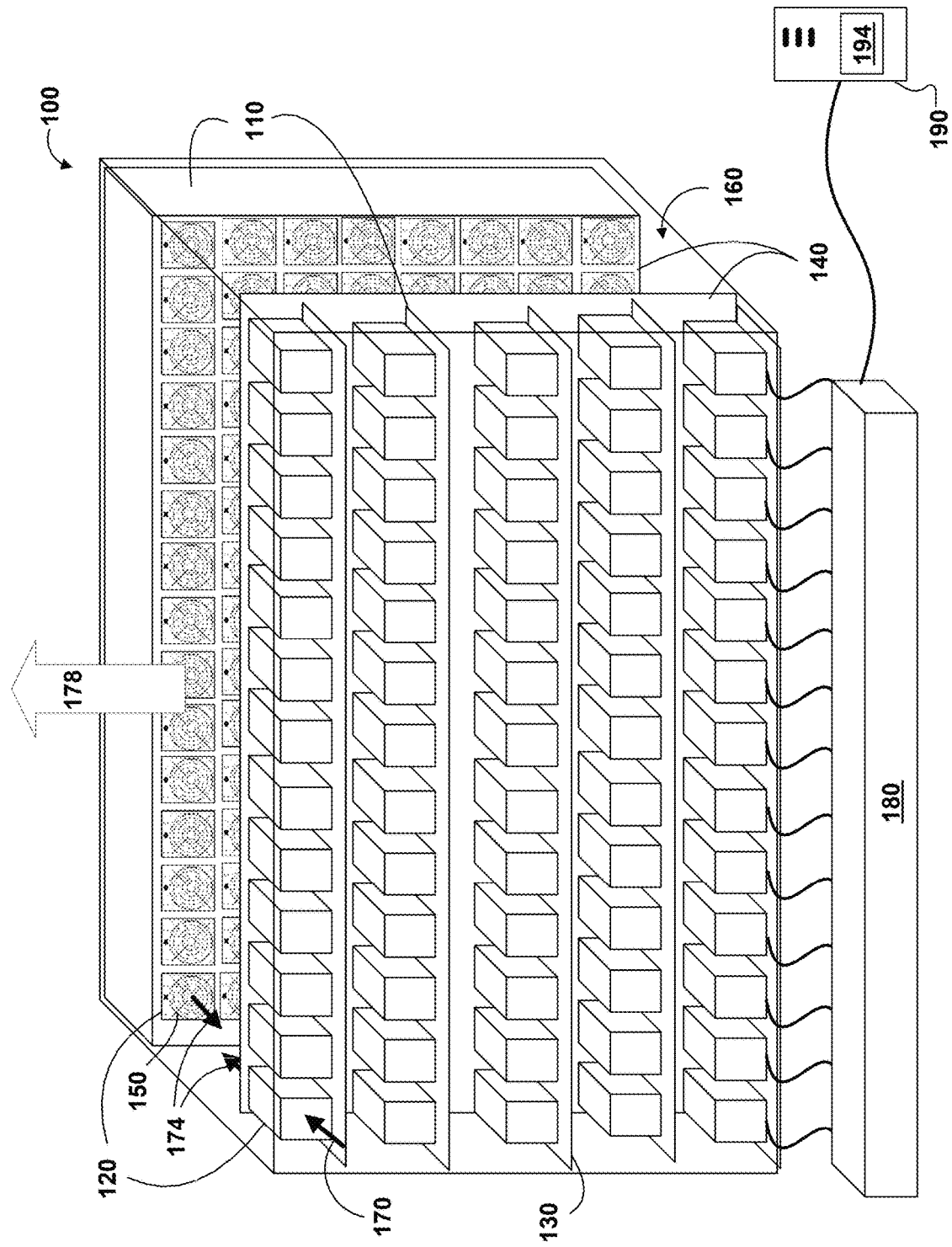
FIG. 1 is a diagram generally illustrating computing devices in a data center.

Turning now to FIG. 1, a diagram generally illustrating computing devices in a data center is shown. This example illustrates a pod 100 that has racks 110 that each have a number of shelves 130 for holding computing devices 120, thereby creating a two-dimensional array of computing devices on each rack or group of racks. In other embodiments, racks 110 may have rails that hold computing devices 120 in place on shelves 130. Each computing device 120 has one or more cooling fans 150 configured to draw air from outside the pod (often called a cool aisle) into the computing device for cooling, as shown by arrow 170. The moving air draws out heat from computing device 120 and is exhausted from the computing device as shown by arrows 174 into the space between racks 110, called a hot aisle 160. For example, there may be one or more exhaust openings (e.g., positioned at one end of each pod or above the center of each pod) to capture the hot waste air and then discharge it out of the data center via vents in the roof of the data center.

In some embodiments, computing device 120 may have two fans, one on the intake side and one on the exhaust side. In other embodiments multiple smaller fans may be used within computing device 120. Heated air is exhausted by computing devices 120 into the space between racks 110, the hot aisle 160. The space between racks 110 is typically sealed except for one or more exhaust openings, typically in the ceiling, through which the heated air exits (as shown by arrow 178). In some embodiments, computing devices 120 are positioned adjacent to an air barrier 140 with openings large enough to allow the heated exhaust air from each computing device 120 to pass into hot aisle 160 but not escape out of hot aisle 160 other than through the exhaust vents.

Computing devices 120 may be networked together with a network switch 180 and may be managed by a management program 194 executing on a management computer 190. The management application or module is typically implemented in software (e.g., instructions stored on a non-volatile storage medium such as a hard disk, flash drive, or DVD-ROM).

In order to better cool computing devices 120, the management program 194 may be configured to dispatch instructions to computing devices 120 setting their operating parameters such as chip frequency, voltage, and fan speed.

Figure 2:
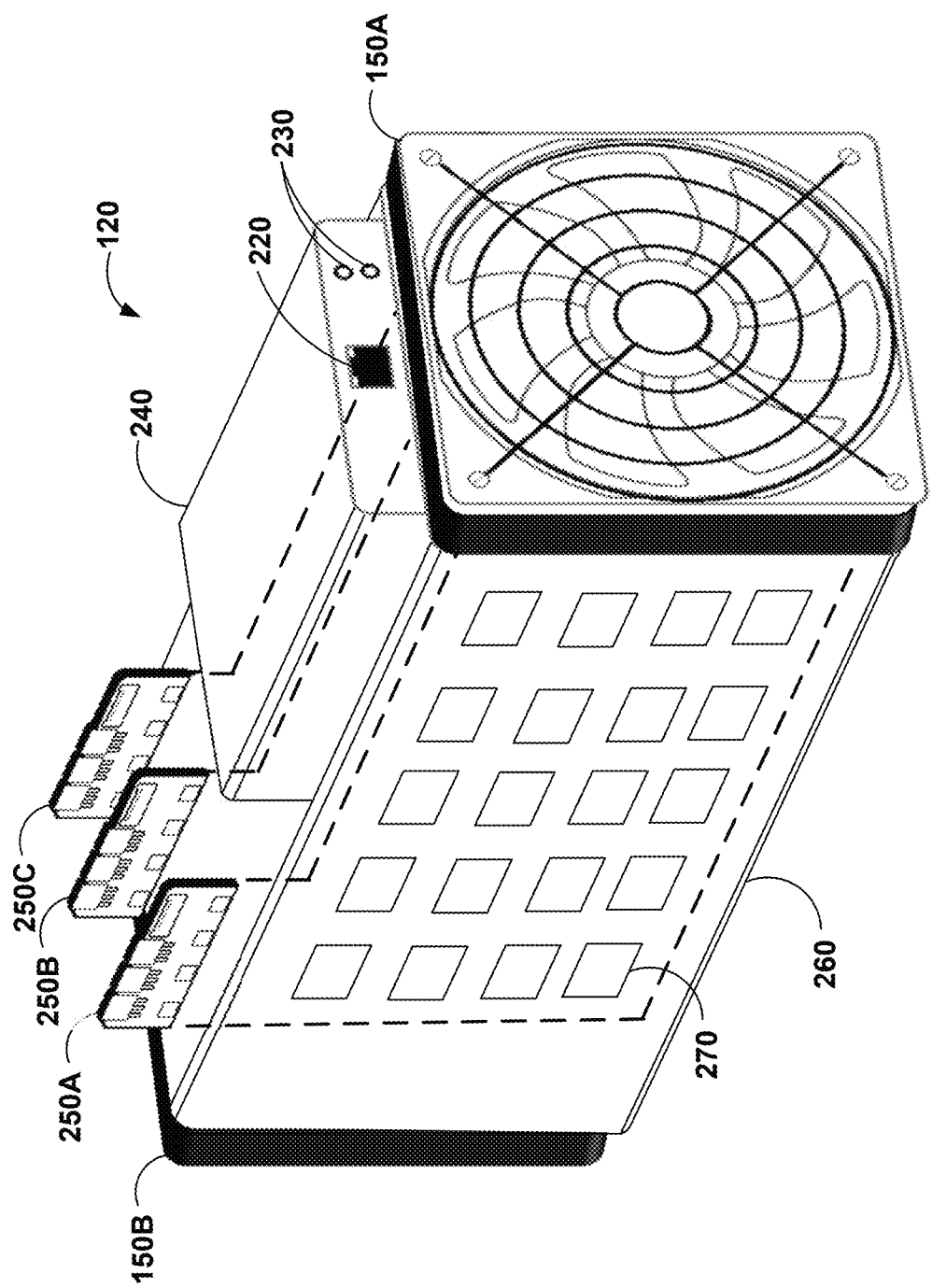
FIG. 2 is a diagram generally illustrating a perspective view of an example computing device.

Turning now to FIG. 2, a diagram generally illustrating a perspective view of an example computing device 120 is shown. In this example, computing device 120 is a crypto-currency miner and includes a controller 240 that oversees operation of the multiple processing circuit boards 250A-C inside the device's case 260. In this embodiment, the controller 240 includes a network port 220 for communications, and one or more status indicator LEDs 230. Two fans 150A-B (one front and one rear) draw cool air into one side of the computing device 120 and expel waste heat through the other side. Other types of computing devices are possible and contemplated.

Circuit boards 250A-C each have multiple processors 270 (e.g., ASICs, GPUs, CPUs, FPGAs) that perform calculations, generating heat. For this reason, processors 270 often have heat sinks attached to them to cool the processors 270 by dissipating the waste heat into the air flowing through the computing device.

Figure 3:
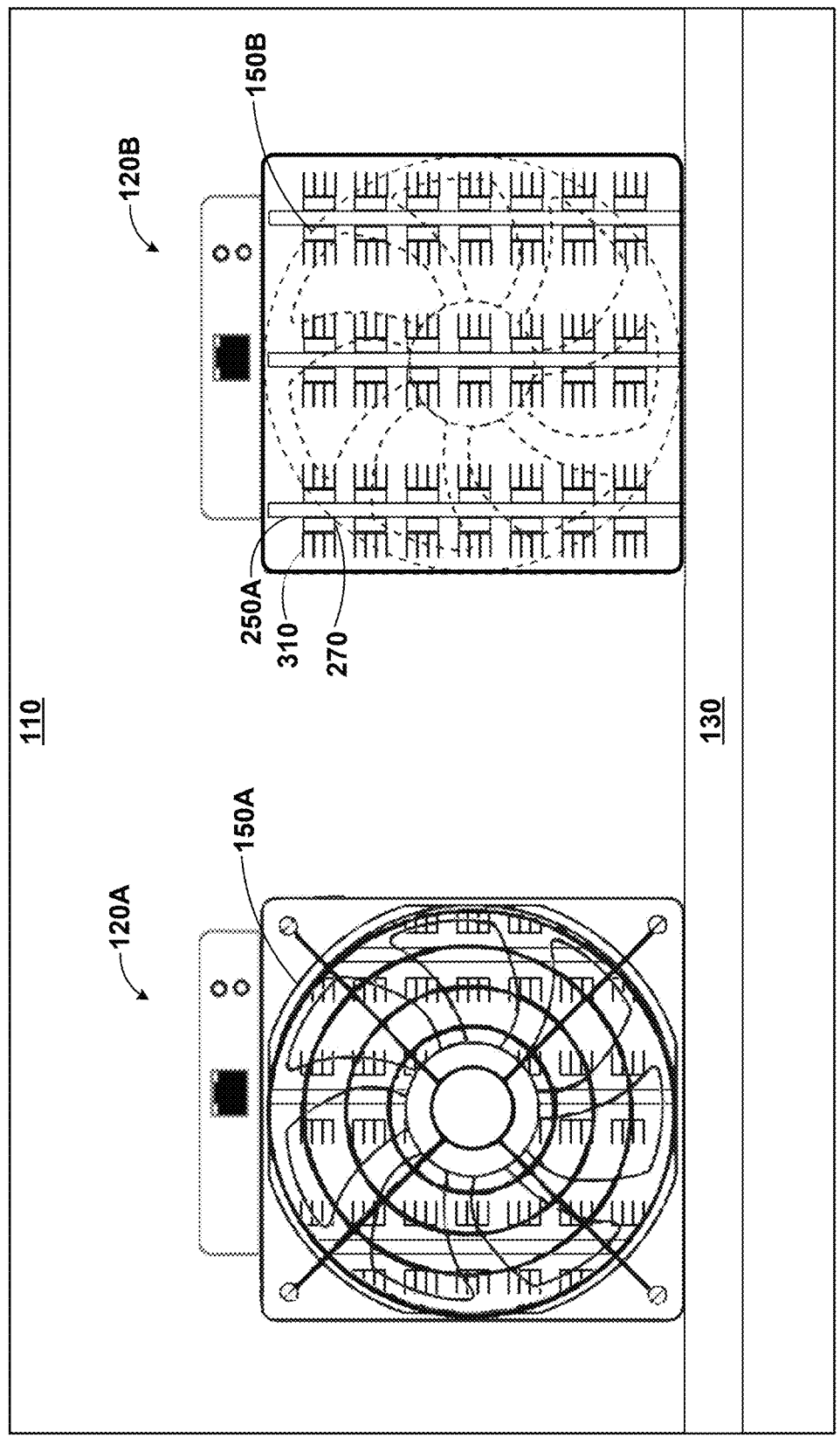
FIG. 3 is a diagram generally illustrating computing devices in a rack.

Turning now to FIG. 3, a diagram generally illustrating computing devices in a rack is shown. A frontal view of two computing devices 120A and 120B positioned on a shelf 130 is shown. In this view, front fans 150A and 150B are shown. Fan 150B is shown partially hidden to allow heatsink 310 connected to processor 270 on circuit board 250A to be seen.

One drawback to this approach is significant energy is required to run the computing devices, resulting in substantial waste heat that is then vented into the atmosphere.

Figure 4:
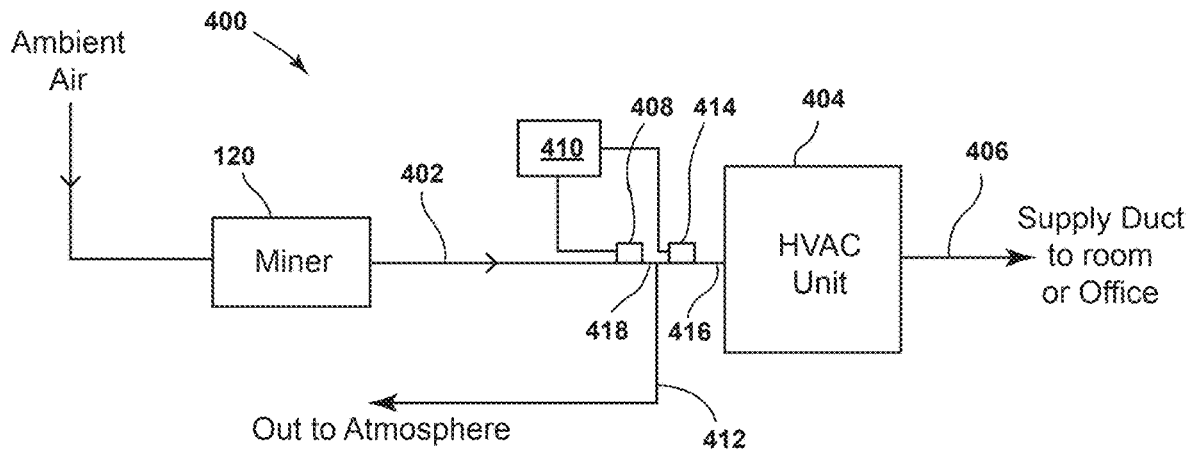
FIG. 4 is a diagram generally illustrating a system for recapturing waste heat from computing devices.

Turning now to FIG. 4, a system 400 for recapturing waste heat of one or more computing devices 120 is shown. Although FIG. 4 schematically shows one computing device 120, it will be appreciated that multiple computing devices 120, e.g., a pod 110, can be incorporated into the system 400 without departing from the scope of the disclosure. The computing device 120 is oriented to pull cool (e.g., ambient) air in from outside and discharge the heated air (e.g., waste heat extracted from the computing device(s) 120) to an exhaust duct 402 that leads to a heating, ventilation, an air conditioning (HVAC) unit 404, which sends the heated air through a supply duct 406 for heating a room, office building, and/or data center. The heated exhaust air from the computing device(s) 120 can take the place of, or supplement the use of, a heating device (not shown) of the HVAC unit 404 ordinarily required to heat air, to thereby save on energy costs. Pursuant to an implementation, the heated exhaust air is flowed through the HVAC unit 404 to be cleaned/filtered by an existing filtration system (not shown) and/or for humidity adjustments (e.g., to increase the relative humidity of the air). The exhaust duct 402 may, for example, be connected to the hot aisle 160 (see FIG. 1) via an exhaust outlet, or connected to a respective computing device 120 at the air outlet of the computing device 120. The computing device(s) 120, via the fans 150, convey the heated exhaust air to the exhaust duct 402, which flows to the HVAC unit 404 to be repurposed as useful heating air. The hot air may then be used by the HVAC unit 404 to heat a room, office building, or the data center. The waste heat generated by the computing device 120 is therefore recaptured by the HVAC unit 404 to save on energy usage and offset carbon usage, as the HVAC heater can be operated at reduced power or switched off so that the energy consumption can be reduced.

At least one sensor 408, for example a temperature sensor and/or a humidity sensor, is arranged in the exhaust duct 402 for measuring and monitoring the temperature and/or humidity of the hot exhaust air. The at least one sensor 408 may monitor the temperature and/or humidity to determine the amount of the heated exhaust air from the computing device(s) 120 that will be sent to the HVAC unit 404. If a temperature of the exhaust air is above a desired or predetermined temperature for use by the HVAC unit 404, the sensor 408 communicates this reading to a controller 410 so that the exhaust air, or a portion thereof, can be rerouted through a bypass duct 412 and released to the atmosphere through air vents (not shown). For example, if the HVAC unit 404 is in a heating mode and the temperature of the heated exhaust air is above a predetermined temperature (e.g., as set by the thermostat), then a reduced flow of exhaust air may be sent to be used by the HVAC unit 404, for example to be mixed with outside (ambient) or recirculated air, and a remainder of the flow may be directed to the bypass duct 412. The bypass duct 412 branches off from the exhaust duct 402 upstream of the HVAC unit 404, to thereby bypass the HVAC unit 404, to be released to the atmosphere.

A control valve 414 is arranged in the exhaust duct 402 upstream of an inlet 416 of the HVAC unit 404 and downstream of a branch off point 418 of the bypass duct 412, and may comprise, e.g., a valve flap, for directing the flow of heated air to the HVAC unit 404 and the bypass duct 412. The control valve 414 is switchable between a plurality of positions including an open position, wherein exhaust air flows from the exhaust duct 402 to the HVAC unit 404, and a closed position, wherein exhaust air is redirected from the exhaust duct 402 to the bypass duct 412 to be released in the atmosphere. Pursuant to an exemplary implementation, when the control valve 414 is in the open position, all or substantially all of the exhaust air flows to the HVAC unit 404 and the valve closes off the bypass duct 412, and when the control valve 414 is in the closed position, all or substantially all of the exhaust air flows to the bypass duct 412 and the valve closes off the HVAC unit 404. The control valve 414 may be switched to the bypass (e.g., closed) position when the temperature is above a predetermined temperature, or when the HVAC unit 404 is in an air conditioning mode and does not require hot air. The control valve 414 is further switchable into one or more intermediate positions between the open position and the closed position, to distribute the flow of exhaust air among the HVAC unit 404 and the bypass duct 412. For example, the control valve 414 may be switched into one or more intermediate positions that provide a reduced flow of hot exhaust air to the HVAC unit 404, and the remainder of the flow is directed to the bypass duct 412 to be released into the atmosphere. In this position, the HVAC heater may be operated at reduced power or switched off, depending on the reading from the at least one sensor 408, to save on energy usage.

Pursuant to an implementation, the controller 410 may be connected (e.g., wirelessly or via control lines) to the at least one sensor 408 and the control valve 414. The controller 410 is configured/programmed to read temperature and/or humidity data from the at least one sensor 408, and determine if the value(s) is above or below a predetermined temperature (e.g., a temperature set on the thermostat). The controller 410 is also configured to control the control valve 414, based on the readings from the at least one sensor 408, to switch between the open position, the closed position, and the intermediate position(s) and control the amount of air flow that leads from the exhaust duct 402 to the HVAC unit 404 and/or the bypass duct 412. For example, the controller 410 may be configured to respond to the measured temperature of the exhaust air (via sensor 408) being below a predetermined temperature by adjusting the control valve 414 to switch into the open position or an intermediate position between fully open and fully closed to selectively increase the flow of exhaust air to the HVAC unit 404, to reach a desired temperature for warming the room, office or data center. Additionally or alternatively, the controller 410 may be configured to respond to the measured temperature of the exhaust air (via sensor 408) being above a predetermined temperature by adjusting the control valve 414 to provide a reduced flow of exhaust air to the HVAC unit 404, to reach a desired temperature for warming the room, office or data center. The controller 410 may additionally be connected to the HVAC unit 404 such that the controller 410 can control the amount of outside (e.g., ambient) and/or recirculating air is sent to the HVAC unit 404 for mixing with the heated exhaust air from the exhaust duct 402. Further, the controller 410 may control the heating device of the HVAC unit 404 to operate at a reduced capacity, if for example a temperature of the exhaust air is below that required for heating the room, office, or data center.

The controller 410 may be a traditional PC or server, or specialized appliance. Controller 410 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust.

Figure 5:
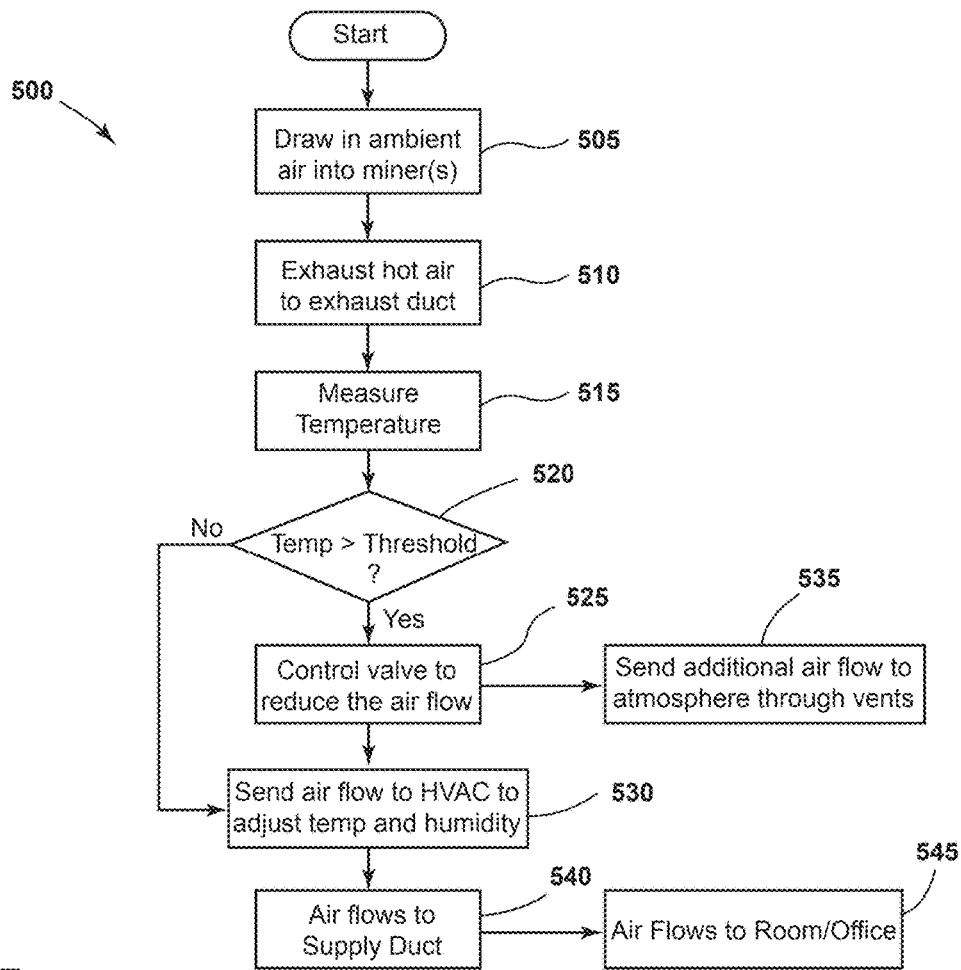
FIG. 5 is a flowchart of an exemplary method for recapturing waste heat from computing devices.

Turning now to FIG. 5, a flowchart of an exemplary method/process 500 of recapturing waste heat from computing devices is shown. The process 500 begins at block 505 with the computing device(s) 120 drawing in air (e.g., ambient air from the outside or recirculated air) for cooling the computing device(s) 120. As the air is drawn in, the air passes through the computing device 120 and extracts heat from the components/electronics (e.g., processor 270) within the computing device 120, and the heated air is then exhausted into the exhaust duct 402 at block 510. Pursuant to an implementation, the exhaust air from the computing device(s) 120 may first flow into a hot isle 160 of a pod 100 and then travel to the exhaust duct 402 via a vent or other exhaust outlet. As the heated exhaust air is conveyed through the exhaust duct 402, the temperature and/or humidity is measured by the at least one sensor 408 at block 515. If the measured temperature is above a threshold or predetermined temperature (block 520), the controller 410 adjust the control valve 414 to reduce the air flow (block 525) and sends the reduced air flow to the HVAC unit 404 to adjust the temperature and/or humidity output by the unit (block 530). The remainder of the air flow is directed to the bypass duct 412 and released to the atmosphere at block 535. If, on the other hand, the measured temperature is below the threshold or predetermined temperature (block 520), the controller 410 controls the control valve 414 to be in the open position and sends the full air flow to the HVAC unit 404 to provide a desired temperature and/or humidity at block 535. The HVAC unit 404 then sends the heated air to a supply duct 406 (block 540) to supply a room, office, or data center with heated air (block 545). The exhaust heat from the computing device(s) 120 is therefore repurposed or recaptured into useful heat by the HVAC unit 404 for heating the room, office, or data center, which saves on energy and offsets carbon usage as the heating device of the HVAC can be operated on reduced power or switched off entirely.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A system for recapturing waste heat from computing devices, comprising:

at least one computing device;

a heating, ventilation, and air conditioning (HVAC) unit;

an exhaust duct leading from the at least one computing device to the HVAC unit;

a bypass duct fluidly connected to the exhaust duct, for bypassing the HVAC unit;

a control valve disposed in the exhaust duct, structured and arranged to switch between an open position where a flow of exhaust air is sent to the HVAC unit, and a closed position where the flow of exhaust air is redirected to the bypass duct;

a controller operatively connected to the control valve and configured to switch the control valve between the closed position and the open position depending on a temperature of the exhaust air.

2. The system of claim 1, wherein the controller is configured to switch the control valve from the closed position to the open position when the temperature is below a predetermined temperature.

3. The system of claim 1, wherein the controller is configured to switch the control valve to an intermediate position when the temperature is above a predetermined temperature, wherein in the intermediate position the control valve directs a partial flow of exhaust air to the HVAC unit and a remainder of the flow of exhaust air to the bypass duct.

4. The system of claim 1, further comprising a temperature sensor for measuring the temperature of air in the exhaust duct.

5. The system of claim 1, wherein the control valve is disposed between the bypass duct and an inlet of the HVAC unit.

6. A method of recapturing waste heat from computing devices, comprising:

drawing in ambient air into at least one computing device, extracting heat from the at least one computing device and exhausting the heated air into an exhaust duct;

measuring a temperature of the heated air in the exhaust duct;

controlling a valve to switch between an open position where the valve sends the heated air to a heating, ventilation, and air conditioning (HVAC) unit, and a closed position where the valve directs the heated air to a bypass duct that releases the heated air to the atmosphere; and switching the valve from the closed position to the open position when the temperature is below a predetermined temperature.

7. The method of claim 6, further comprising switching the valve from the open position to an intermediate position when the temperature is above the predetermined temperature, wherein in the intermediate position the control valve directs a partial flow of heated air to the HVAC unit and a remainder flow of the heated air to the bypass duct.

* * * * *